US010937689B2

(12) United States Patent
Chandhok et al.

(10) Patent No.: US 10,937,689 B2
(45) Date of Patent: Mar. 2, 2021

(54) SELF-ALIGNED HARD MASKS WITH CONVERTED LINERS (71) Applicant: Intel Corporation, Santa Clara, CA (US)

(72) Inventors: Manish Chandhok, Beaverton, OR (US); Satyarth Suri, Portland, OR (US); Tristan A. Tronic, Aloha, OR (US); Christopher J. Jezewski, Portland, OR (US); Richard E. Schenker, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 16/465,510

(22) PCT Filed: Dec. 30, 2016

(86) PCT No.: PCT/US2016/069359
§ 371 (c)(1),
(2) Date: May 30, 2019

(87) PCT Pub. No.: WO2018/125175
PCT Pub. Date: Jul. 5, 2018

(65) Prior Publication Data
US 2019/0371657 A1    Dec. 5, 2019

(51) Int. Cl.
*H01L 21/768* (2006.01)
*H01L 23/522* (2006.01)
*H01L 21/02* (2006.01)

(52) U.S. Cl.
CPC .. *H01L 21/76831* (2013.01); *H01L 21/76802* (2013.01); *H01L 21/76843* (2013.01); *H01L 21/76883* (2013.01); *H01L 21/76888* (2013.01); *H01L 21/76897* (2013.01); *H01L 23/5226* (2013.01); *H01L 21/02252* (2013.01)

(58) Field of Classification Search
CPC ........ H01L 21/76831; H01L 21/76802; H01L 21/76843; H01L 21/76883; H01L 21/76888; H01L 21/76897; H01L 23/5226; H01L 21/02252; H01L 21/76834; H01L 21/76856
See application file for complete search history.

(56) References Cited

U.S. PATENT DOCUMENTS

| 2005/0051900 A1 | 3/2005 | Liu et al. |
| 2010/0035430 A1 | 2/2010 | Andry et al. |
| 2010/0078825 A1 | 4/2010 | Patz et al. |

(Continued)

FOREIGN PATENT DOCUMENTS

WO    2018125175 A1    7/2018

OTHER PUBLICATIONS

PCT Sep. 26, 2017 International Search Report and Written Opinion of International Application No. PCT/US2016/069359; 10 pages.

*Primary Examiner* — Karen Kusumakar
(74) *Attorney, Agent, or Firm* — Patent Capital Group (57) ABSTRACT In one embodiment, a trench may be formed in a dielectric surface, and the trenched may be lined with a liner. The trench may be filled with a metal, and the metal may be recessed below an opening of the trench. The liner may be converted into a dielectric, and a hard mask may be deposited into the trench.

20 Claims, 7 Drawing Sheets (56) References Cited

U.S. PATENT DOCUMENTS

| | | |
|---|---|---|
| 2014/0199832 A1 | 7/2014 | Nguyen et al. |
| 2015/0270156 A1* | 9/2015 | Lin .................... H01L 23/5226 |
| | | 257/622 |
| 2015/0270211 A1* | 9/2015 | Kobrinsky ........ H01L 23/53295 |
| | | 257/758 |
| 2016/0163587 A1 | 6/2016 | Backes et al. |
| 2016/0218286 A1* | 7/2016 | Lin ......................... H01L 45/04 |

* cited by examiner

SELF-ALIGNED HARD MASKS WITH CONVERTED LINERS

CROSS-REFERENCE TO RELATED APPLICATION

This application is a national stage application under 35 U.S.C. § 371 of PCT International Application Serial No. PCT/US2016/069359, filed on Dec. 30, 2016 and entitled "SELF-ALIGNED HARD MASKS WITH CONVERTED LINERS," which is hereby incorporated by reference herein in its entirety.

FIELD OF THE SPECIFICATION

This disclosure relates in general to the field of integrated circuits, and more particularly, though not exclusively to, self-aligned hard masks.

BACKGROUND

A semiconductor circuit or chip may include multiple layers of interconnects. Moreover, interconnects in different layers of the chip may be connected using vias. A via is an electrical connection between different interconnect layers that extends through the plane of a chip. The interconnects of these chips are being manufactured using decreasingly smaller pitches (e.g., narrower and/or closer together) in order to accommodate the need for smaller chips. As the pitch of an interconnect decreases, however, it becomes increasingly difficult to properly align a via with the particular interconnect. In particular, during manufacturing, the alignment of a via with respect to a corresponding interconnect of a particular layer will vary due to natural variations in the manufacturing process, resulting in misalignment between the via and the interconnect. If the via is misaligned to the extent that it unintentionally comes in contact with the wrong interconnect or another unintended metal component, the chip may short circuit, resulting in degraded performance and/or a faulty chip.

BRIEF DESCRIPTION OF THE DRAWINGS

The present disclosure is best understood from the following detailed description when read with the accompanying figures. It is emphasized that, in accordance with the standard practice in the industry, various features are not necessarily drawn to scale, and are used for illustration purposes only. Where a scale is shown, explicitly or implicitly, it provides only one illustrative example. In other embodiments, the dimensions of the various features may be arbitrarily increased or reduced for clarity of discussion.

EMBODIMENTS OF THE DISCLOSURE

The following disclosure provides many different embodiments, or examples, for implementing different features of the present disclosure. Specific examples of components and arrangements are described below to simplify the present disclosure. These are, of course, merely examples and are not intended to be limiting. Further, the present disclosure may repeat reference numerals and/or letters in the various examples. This repetition is for the purpose of simplicity and clarity and does not in itself dictate a relationship between the various embodiments and/or configurations discussed. Different embodiments may have different advantages, and no particular advantage is necessarily required of any embodiment.

A semiconductor circuit or chip may include multiple layers of interconnects formed using one or more metallization stacks (e.g., the metallization stacks from FIGS. 1-7, described below). Moreover, interconnects in different layers of the chip may be connected using vias. A via is an electrical connection between different interconnect layers that extends through the plane of a chip. The interconnects of these chips are being manufactured using decreasingly smaller pitches (e.g., narrower and/or closer together) in order to accommodate the need for smaller chips. As the pitch of an interconnect decreases, however, it becomes increasingly difficult to properly align a via with the particular interconnect. In particular, during manufacturing, the alignment of a via with respect to a corresponding interconnect of a particular layer will vary due to natural variations in the manufacturing process, resulting in misalignment between the via and the interconnect. If the via is misaligned to the extent that it unintentionally comes in contact with the wrong interconnect or another unintended metal component, the chip may short circuit, resulting in degraded performance and/or a faulty chip. Accordingly, a via must be aligned to the appropriate interconnect within a particular margin of error in order to avoid erroneously connecting or shorting to the wrong interconnect or other metal component. Although the size of a via could be decreased to reduce the impact of misalignment, reducing the via size may result in degraded performance (e.g., due to higher resistance) and also reduced yield for via manufacturing.

Accordingly, in some embodiments, vias may be created using self-aligned hard masks with converted liners. A self-aligned hard mask, for example, is an etch mask that can be used to steer a next-layer via to land on the metal below the hard mask (e.g., the metal in a particular trench used to form an interconnect).

For example, an interlayer dielectric (ILD) may be patterned to form a trench, and the trench may be lined with a metallic liner (e.g., metallic or metal nitride). The liner, for example, may be used as an adhesive between the ILD and any metal deposited in the trench, and may also prevent metal from leaking out of the trench into the ILD. The trench may then be filled with metal, and the metal may then be polished to remove any excess metal flowing from the trench. The metal may then be recessed below the top of the trench to form a hollow portion above the metal in the trench, which can be used as the housing for the hard mask.

The metal recess process, however, is selective to the metallic liner (e.g., metallic or metal nitride), and thus the liner remains even after recessing the metal. Moreover, since the liner is a conductive metal material, leaving it behind is counterproductive to the via alignment and steering problem. In some cases, an additional process could be used to remove the liner. Alternatively, however, the liner can be modified to make it a leave behind dielectric. For example, if the liner is a nitride and is exposed to an oxidizing plasma, then it will be converted into an oxide. Metal oxides are typically dielectrics. Besides oxides, other types of conversions into metallic dielectrics include processes that would result in silicates, oxynitrides, or any other non-leaky dielectric. In this manner, the liner may simply be converted into a leave behind dielectric rather than removing the liner altogether, as it is much more efficient to convert the liner instead of removing it.

After the liner is converted into a leave behind dielectric, the particular hard mask material can then be deposited into the hollow portion of the trench on top of the recessed metal. Given that depositing the hard mask material into the hollow portion of the trench results in the hard mask being positioned directly above the metal, the hard mask is "self-aligned" by design. The hard mask material may then be polished to remove any excess hard mask material flowing from the trench. At this point, a via can be created using the hard mask to steer the via, for example, by etching the hard mask using an etching approach that is selective to the hard mask material and not the surrounding ILD.

Accordingly, converting the liner of a self-aligned hard mask into a leave-behind dielectric avoids the problem of having to recess the liner after the metal is recessed. This invention is particularly useful when the pitch (metal width+ILD width) is approximately 40 nanometers (nm) or smaller.

Example embodiments that may be used to implement the functionality of this disclosure are described below with more particular reference to the attached FIGURES.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale.

In the following detailed description, various aspects of the illustrative implementations are described using terms commonly employed by those skilled in the art to convey the substance of their work to others skilled in the art. For example, as used herein, a "high-k dielectric" refers to a material having a higher dielectric constant than silicon oxide. In another example, a term "interconnect" is used to describe any element formed of an electrically conductive material for providing electrical connectivity to one or more components associated with an IC or/and between various such components. In general, the "interconnect" may refer to both trenches (also sometimes referred to as "lines") and vias. In general, a term "trench" is used to describe an electrically conductive element isolated by an interconnect support layer typically comprising an interlayer low-k dielectric that is provided within the plane of an IC chip. Such trenches are typically stacked into several levels. On the other hand, the term "via" is used to describe an electrically conductive element that interconnects two or more trenches of different levels. To that end, vias are provided substantially perpendicularly to the plane of an IC chip. A via may interconnect two trenches in adjacent levels or two trenches in not adjacent levels. A term "metallization stack" refers to a stack of one or more interconnects for providing connectivity to different circuit components of an IC chip.

Figure 1:
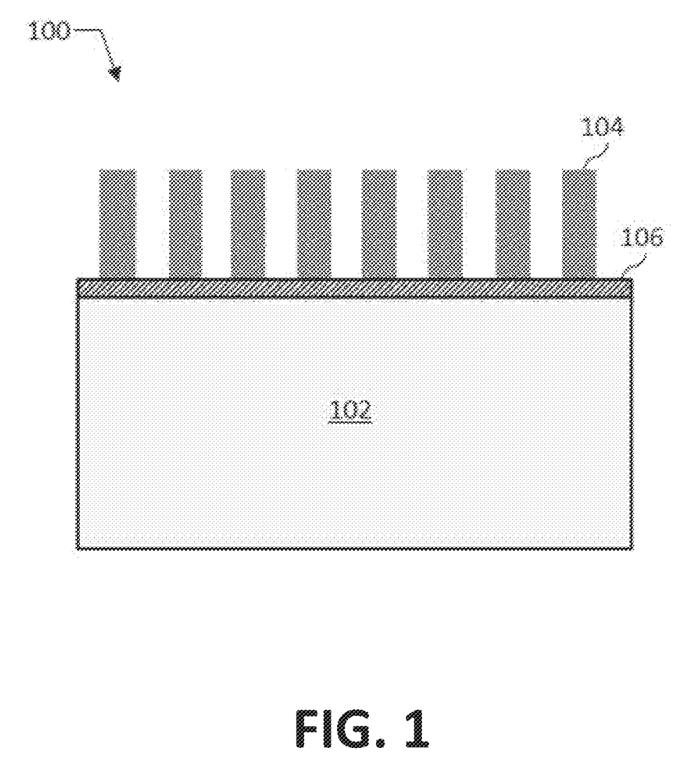
FIG. 1 illustrates a cross-sectional side view of a metallization stack with a plurality of interconnects.

FIG. 1 is a cross-sectional side view of a metallization stack 100 including an interconnect support layer 102 housing a plurality of electrically conductive interconnects 104, in accordance with various embodiments. Only one interconnect 104 is labeled with a reference numeral in FIG. 1 for ease of illustration, but eight are illustrated in FIG. 1. Although eight interconnects 104 are illustrated in FIG. 1, this is also simply for ease of illustration, and more, or less, than eight interconnects 104 may be provided on the interconnect support layer 102 according to various embodiments of the present disclosure. Furthermore, note that the metallization stack 100 shown in FIG. 1, as well as structures illustrated in FIGS. 2-7 are intended to show relative arrangements of the components therein, and that various metallization stacks, or portions thereof, may include other components that are not illustrated (e.g., electrical contacts to the interconnects 104).

In general, implementations of the disclosure may be formed or carried out on a substrate, such as a semiconductor substrate composed of semiconductor material systems including, for example, N-type or P-type materials systems. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. Although a few examples of materials from which the substrate may be formed are described here, any material that may serve as a foundation upon which a semiconductor device may be built falls within the spirit and scope of the present disclosure.

In various embodiments the interconnect support layer 102 may include any such substrate, possibly with some layers and/or devices already formed thereon, that provides a suitable surface for providing the interconnects 104 on. In the example shown in FIG. 1, an etch stop layer 106 is shown to be disposed over the interconnect support layer 102, which layer may serve to prevent or minimize etching into the underlying interconnect support layer 102 during fabrication of the interconnects 104 or any further components associated with an integrated circuit. However, presence of such a layer is entirely optional and embodiments of the present disclosure may be carried out on the interconnect support layer 102 within the etch stop layer 106 shown in FIGS. 1-7. In other embodiments, other layers, not shown in the present FIGs, may be provided on at least some portions of the interconnect support layer 102 prior to the deposition of the interconnects 104, such as an insulating layer (e.g., an oxide isolation layer).

Furthermore, other materials or/and layers, not specifically shown in FIG. 1 may be provided over the interconnects 104 of the metallization stack. One such material is a dielectric material, e.g. including one or more interlayer dielectrics (ILD) layers, that may be deposited over the and in between the interconnects 104 of the metallization stack 100. The ILD layers may be formed using dielectric materials known for their applicability in integrated circuit structures, such as low-k dielectric materials. Examples of dielectric materials that may be used include, but are not limited to, silicon dioxide (SiO2), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

FIGS. 2-7 illustrate various example stages in the manufacture of a metallization stack including a plurality of electrically conductive interconnects, such as e.g. the metallization stack 100 with the interconnects 104, in accordance with various embodiments. Although the particular manufacturing operations discussed below with reference to FIGS. 2-7 are illustrated as manufacturing a particular embodiment of the metallization stack 100, at least some of these operations and/or operations with minor modifications may be applied to manufacturing many different embodiments of the metallization stack 100, as discussed herein. Any of the elements discussed below with reference to FIGS. 2-7 may take the form of any of the embodiments of those elements discussed above or otherwise disclosed herein.

Figure 2:
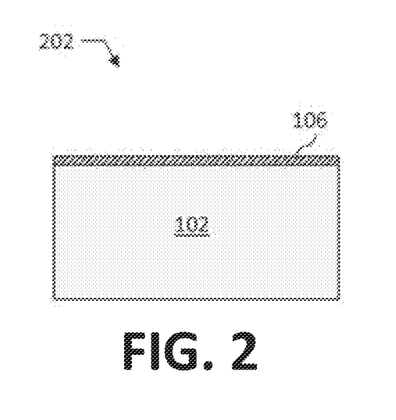
FIGS. 2-7 illustrate various example stages for manufacturing a metallization stack with a plurality of interconnects.

FIG. 2 illustrates a cross-sectional view of an assembly 202 including an interconnect support layer 102 and an etch stop layer 106 provided thereon. Discussions provided above with respect to the interconnect support layer 102 and the etch stop layer 106 are applicable here and, therefore, in the interests of brevity, are not repeated here.

Figure 3:
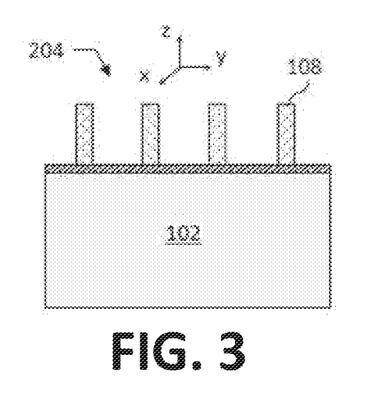

FIG. 3 illustrates a cross-sectional view of an assembly 204 subsequent to providing a pattern of sacrificial elements 108 over the interconnect support layer 102 of the assembly 202 (FIG. 2). Only one sacrificial element 108 is labeled with a reference numeral in FIG. 3 for ease of illustration, but four are illustrated in FIG. 3. Although four sacrificial elements 108 are illustrated in FIG. 3, this is also simply for ease of illustration, and more, or less, than four sacrificial elements 108 may be provided on the interconnect support layer 102 according to various embodiments of the present disclosure.

In other embodiments, any other suitable pattern may be used, selected/designed so that, in subsequent fabrication steps, the electrically conductive material deposited on the sidewalls (i.e., the faces of the elements 108 which are substantially perpendicular to the interconnect support layer 102) of the sacrificial elements 108 will form appropriately shaped and appropriately located interconnects.

In some embodiments, the aspect ratio (i.e., a ratio of height to width) of the sacrificial elements 108 could be between 1 and 10, e.g. between 1 and 5 or between 1 and 3. The sacrificial elements 108 may be spaced by any suitable spacing that would allow depositing electrically conductive material of the desired thickness on the sidewalls of the sacrificial elements 108 so that the electrically conductive material on adjacent sidewalls of two adjacent elements 108 is not touching one another. For example, in some embodiments, the distance between different sacrificial elements 108 may be above 30 nanometers, e.g. above 50 nanometers.

In some embodiments, the sacrificial elements 108 may be formed of a non-metallic material. Since the sacrificial elements 108 will need to later be etched to leave the electrically conductive material deposited on their sidewalls, e.g. using anisotropic etching, etching properties of potential candidate materials are to be considered when selecting a suitable material to be used as the sacrificial elements 108. In addition, etching properties of a potential candidate material for the sacrificial elements 108 should are to be considered in view of a potential candidate electrically conductive material for forming the interconnects as described herein. Preferably the material for the sacrificial elements 108 and the electrically conductive material for the future interconnects 104 have sufficiently distinct etching properties so that etch of the sacrificial elements 108 will not affect, or will only have an adequately small effect, on the electrically conductive material (i.e., these two materials should have high etch selectivity with respect to one another). Besides appropriate etching characteristics, some other considerations in selecting a suitable material for the sacrificial elements 108 may include e.g. possibilities of smooth film formation, low shrinkage and outgassing, and good dielectric properties (such as low electrical leakage, suitable value of a dielectric constant, and thermal stability). Examples of materials that could be used to form the sacrificial elements 108 include, but are not limited to, silicon dioxide (SiO2), carbon doped oxide (CDO), silicon nitride, organic polymers such as perfluorocyclobutane, polytetrafluoroethylene or poly(methyl methacrylate) (PMMA), fluorosilicate glass (FSG), and organosilicates such as silsesquioxane, siloxane, or organosilicate glass.

In some embodiments, the sacrificial elements 108 may be provided over the interconnect support layer 102 using e.g. chemical vapor deposition or/and plasma-enhanced chemical vapor deposition, in combination with patterning (either before or after the deposition of the material of the sacrificial elements 108), as typically done in conventional processing. In some embodiments, patterning may include any patterning technique employing photoresist or other masks defining the dimensions and location of the sacrificial elements 108 over the interconnect support layer 102. In other embodiments, patterning may include any mask-less patterning technique, such as e.g. electron beam (e-beam) patterning.

Figure 4:
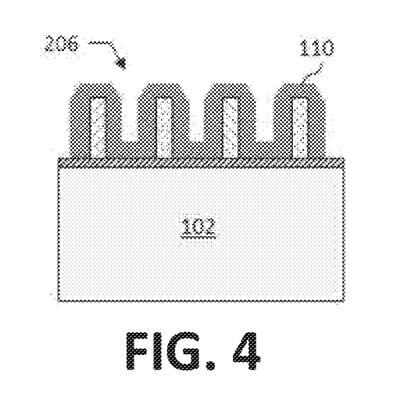

FIG. 4 illustrates a cross-sectional view of an assembly 206 subsequent to conformally depositing a layer 110 of electrically conductive material on the sidewalls and in openings between the sacrificial elements 108 of the assembly 204 (FIG. 3). Conformal deposition generally refers to deposition of a certain coating (in this case, the electrically conductive material that will form the interconnects 104) on any exposed surface of a given structure (in this case, the interconnect support layer with the sacrificial elements 108 of the assembly 204), including on the sidewalls and bottom of any opening formed in/on the structure. A conformal coating may, therefore, be understood as a coating that is applied to exposed surfaces of a given structure, and not, for example, just to horizontal surfaces. In some embodiments, the coating may exhibit a variation in thickness of less than 35%, including all values and ranges from 1% to 35%, such as 10% or less, 15% or less, 20% of less, 25% or less, etc. The conformal coating process may be selected from processes such as e.g. chemical vapor deposition (CVD) or atomic layer deposition (ALD).

In various embodiments, a thickness of the layer 110, in particular the thickness of the layer 110 on the sidewalls of the sacrificial elements 108 (i.e., the dimension in the y-direction of an exemplary reference coordinate system shown in FIG. 3), may take on any suitable values so that, in subsequent fabrication steps, the electrically conductive material deposited on the sidewalls of the sacrificial elements 108 will form interconnects 104 of appropriate dimensions, the latter described in greater detail below.

In some embodiments, an annealing process may be carried out on the layer 110 after its deposition to improve the quality of the electrically conductive material for the future interconnects 104. In various embodiments, the electrically conductive material of the layer 110 may include one or more of aluminum, copper, tungsten, cobalt, ruthenium, nickel, iron, and molybdenum, and/or one or more alloys comprising aluminum, copper, tungsten, cobalt, ruthenium, manganese, magnesium, boron, phosphorus, nitrogen, carbon, and sulfur.

Figure 5:
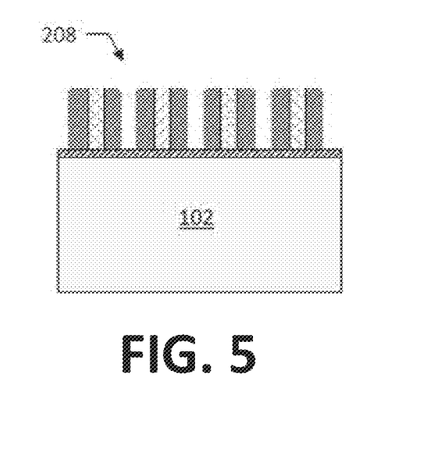

FIG. 5 illustrates a cross-sectional view of an assembly 208 subsequent to anisotropic etch of the layer 110 of the electrically conductive material deposited on the sidewalls and in the openings between the sacrificial elements 108 in the assembly 206 (FIG. 4). Any suitable anisotropic etching technique (i.e., etching uniformly in vertical direction) may be used to etch the electrically conductive material of the layer 110 so that the material is only left on the sidewalls, and possibly on top of, the sacrificial elements 108, but not in the openings between the sacrificial elements 108. Dry etching techniques, such as e.g. plasma etching, are typically known to provide finer resolution and directionality of etching than wet etching techniques which typically result in isotropic etching (i.e., etching in all directions). For example, the layer 110 made of metallic aluminum (Al) can be readily and anisotropically etched with chlorine (Cl) plasma by forming volatile Al2Cl6, where volatile Al2Cl6 is removed, resulting in patterned Al that remains only on the sidewalls, and possibly on top of, the sacrificial elements 108. A vertical anisotropic etch of the electrically conductive material of the layer 110 may be performed so that a portion of the electrically conductive material on the sidewalls of the sacrificial elements 108 is removed as well, which may advantageously decrease surface roughness of the electrically conductive material on the sidewalls of the sacrificial elements 108.

FIGS. 4 and 5 illustrate one exemplary embodiment for depositing an electrically conductive material on the sidewalls of the sacrificial elements 108. In other embodiments, other techniques may be used. For example, instead of a conformal deposition process shown in FIG. 4, other processes may be used that would deposit the electrically conductive material directly only, or substantially only, on the sidewalls of the sacrificial elements 108. Such alternative processed may e.g. include physical vapor deposition (PVD) processes such as, magnetron sputtering with a high re-sputter rate with no net deposition on horizontal surfaces and only sidewall deposition, evaporative deposition or e-beam deposition, and may directly result in the assembly 208 as shown in FIG. 5 without the need for the anisotropic etch described above. Considerations regarding a thickness of the electrically conductive material on the sidewalls of the sacrificial elements 108, as well as considerations regarding the selection and possible anneal of the electrically conductive material provided above are applicable to such alternative deposition processes and, therefore, in the interests of brevity, are not repeated here.

For any deposition technique used to deposit an electrically conductive material on the sidewalls of the sacrificial elements 108 described above, planarization of the assembly 208 may be subsequently performed, in order to expose the material of the sacrificial elements 108 for the subsequent etching of this material. Planarization may be performed using either wet or dry planarization processes. In one embodiment, planarization is performed using chemical mechanical planarization (CMP), which may be understood as a process that utilizes a polishing surface, an abrasive and a slurry to remove the overburden of the electrically conductive material which may cover upper surfaces of the sacrificial elements 108 to expose such surfaces for the subsequent etch.

Figure 6:
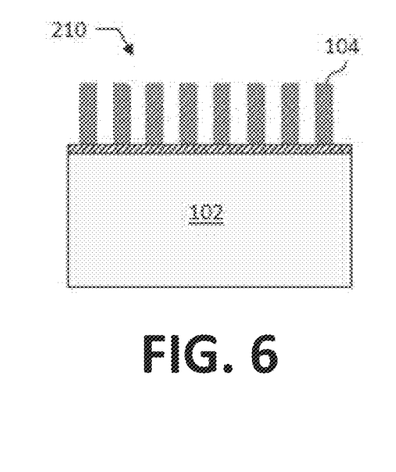

FIG. 6 illustrates a cross-sectional view of an assembly 210 subsequent to the removal of the sacrificial elements 108 from between the electrically conductive material deposited on the sidewalls of the sacrificial elements 108 in the assembly 208 (FIG. 5). In some embodiments, such a removal may include anisotropic etch to vertically etch away the material of the sacrificial elements 108. Etchants used in this etch would be different from those described above for etching the electrically conductive material, because this time, preferably, the electrically conductive material would not be etched. Any substance suitable for anisotropically etching the sacrificial elements 108 may be used in forming the assembly 210.

Removal of the sacrificial elements 108 results in forming a pattern of electrically conductive elements, as e.g. shown in the assembly 210, which form a plurality of interconnects 104. In fact, the assembly 210 shown in FIG. 6 is substantially the same as the metallization stack 100 shown in FIG. 1.

Figure 7:
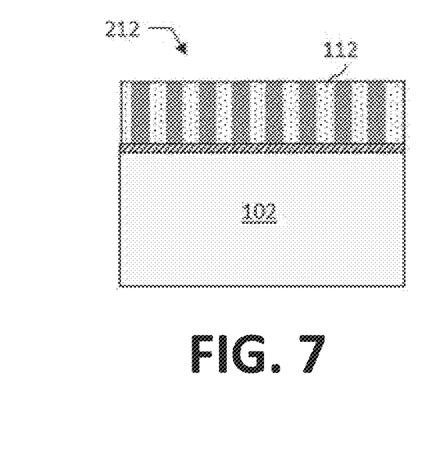

FIG. 7 illustrates a cross-sectional view of an assembly 212 subsequent to filling the spaces between the interconnects 104 of the assembly 210 (FIG. 6) with a suitable dielectric material 112, such as e.g. any of the ILD materials described herein. In some embodiments, the dielectric material 112 may be provided into the spaces between the interconnects 104 using e.g. CVD and/or plasma-enhanced CVD, as typically done in conventional processing. In still other embodiments, the dielectric material 112 may include a dielectric material formed in the spaces between the interconnects 104 using coating techniques involving cross-linking of liquid precursors into solid dielectric materials.

In some embodiments, some or all of the surfaces of the interconnects 104 of the assembly 210 may be cleaned or treated prior to applying the dielectric 112, e.g. to reduce surface contamination, minimize interface traps, promote adhesion, and/or decrease interdiffusion of materials.

For example, the surfaces of the interconnects 104 may be cleaned using chemical or plasma clean, or applying heat in a controlled environment.

In some embodiments, an "interface layer" may be applied between on the interconnects 104 of the assembly 210, in particular on the sidewalls of the interconnects 104, to prevent, decrease, or minimize spontaneous and uncontrolled formation of other interfacial layers.

In some embodiments, an adhesion promoter or adhesion layer may be applied prior to application of the dielectric 112, in order to promote adhesion between the electrically conductive material of the interconnects 104 and the material(s) of the dielectric 112 filling the space between the interconnects 104. Example materials which could be used to form an adhesion layer between the electrically conductive material of the interconnects and the dielectric 112 include, but are not limited to molecular species such as self-assembled monolayers (SAMs). These molecules typically include a head group, an alkane chain, and an end group. The head group could be a thiol or nitrile which forms a bond with the conductive material. The end group could be an amine, silane, ethoxy silane, chloro silane or amino silane which forms bonds with the dielectric.

In some embodiments, before filling in spaces between the interconnects 104 of the assembly 210 with the dielectric material, a diffusion barrier layer may be conformally deposited, using any suitable conformal deposition techniques as described herein, on the sidewalls of at least some, preferably all, of the interconnects 104, for preventing diffusion of the electrically conductive material of the interconnects 104 out of these elements and into the surrounding dielectric material 112. In various embodiments, a diffusion barrier layer may be electrically conductive, semiconducting, or dielectric. Examples of materials that could be used for the diffusion barrier layer include, but are not limited to, one or more of tantalum (Ta), tantalum nitride (TaN), titanium (Ti), titanium nitride (TiN), ruthenium (Ru), cobalt (Co), silicon nitride (SiN), silicon carbide (SiC), silicon dioxide (SiO2), aluminum oxide (Al2O3), and the like.

In further embodiments, the method may further include providing a barrier-dielectric adhesion layer on sidewalls of at least some of the interconnects 104 covered with a diffusion barrier layer, in order to promote adhesion between the material of the diffusion barrier layer and the material(s) of the dielectric 112 that will fill the space between the interconnects 104. Example materials which could be used to form a barrier-dielectric adhesion layer include, but are not limited to, tantalum, titanium, titanium nitride, tantalum nitride, tungsten nitride, molybdenum nitride, and the like.

After filling in spaces between the electrically conductive elements 104 with the dielectric material 112, optionally, planarization may be performed again, e.g. using any of the planarization techniques described above, to expose the upper surfaces of the interconnects 104 so that the interconnects 104 may be electrically connected to further circuit elements (not specifically shown in FIG. 7).

Fabricating the interconnects 104 by depositing the electrically conductive material of the interconnects 104, typically a metal, in a spacer-like fashion (i.e., as a "spacer" around the sacrificial elements 108), followed by the removal of the sacrificial elements 108, as described above, justifies the name "subtractive metal spacer based deposition" given to the methods of fabricating interconnects described herein. Implementing these methods may allow realizing several advantages, in particular when compared to conventional methods of providing interconnects by, first, depositing a layer of metal, and then patterning the metal to form interconnects of desired shapes and in desired patterns.

One advantage is that the methods described herein do not obscure alignment and metrology marks in the frame of the die during deposition of interconnects.

Another advantage relates to the resulting interconnects having decreased surface roughness on their sidewalls compared to what could be achieved using prior art fabrication methods. In some embodiments, a width of an individual interconnect (i.e., the dimension in the y-direction of the exemplary reference system shown in the FIGURES) formed using the methods described herein, e.g. of an individual interconnect 104, along a height of that interconnect may vary by less than 10 percent, preferably less than 5%, e.g. less than 3 or 2%, of an average width of the interconnect along the height of the interconnect. Having a width of an interconnect varying by less than a certain, relatively small, amount compared to the average width along the height of the interconnect indicates that the sidewalls of the interconnect have relatively low surface roughness. Such relatively slow surface roughness may be advantageously achieved using the methods of forming electrically conductive interconnects as described herein and was not possible to achieve using prior art fabrication techniques.

Metallization stacks as described herein may be particularly advantageous when used in the metal layers of a microprocessor device (e.g., for analog circuitry, logic circuitry, or memory circuitry), and may be formed along with other complementary metal oxide semiconductor (CMOS) processes. For example, in some embodiments, the vias used to connect the interconnects 104 in different layers may be formed using self-aligned hard masks with converted liners, as described below in connection with FIGS. 8A-E.

Figure 10A:
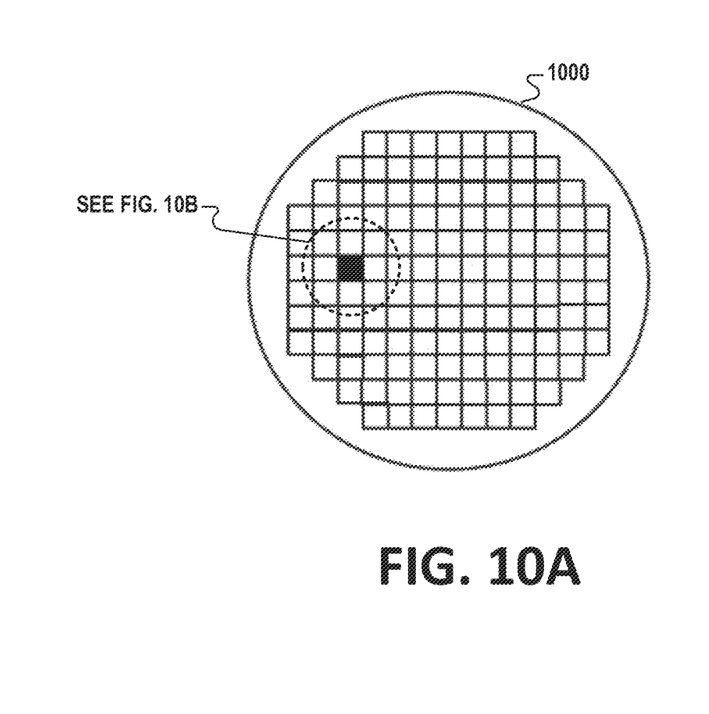
FIGS. 10A and 10B illustrate top views of a wafer and dies that may include one or more metallization stacks.
Figure 10B:
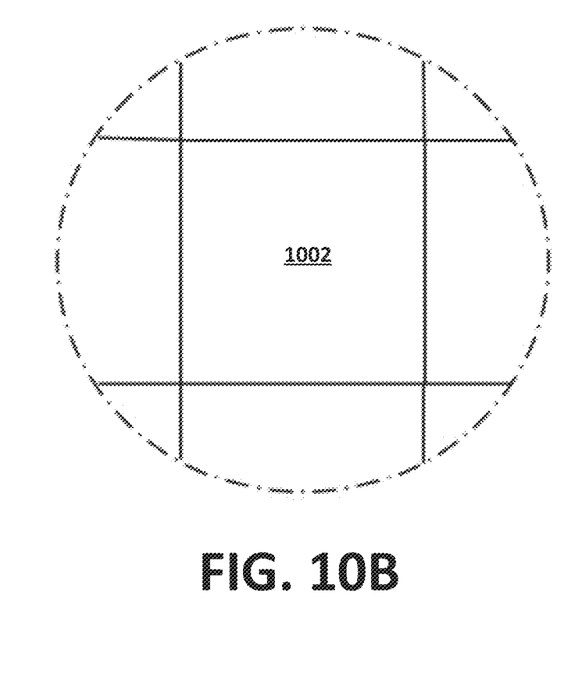
Figure 11:
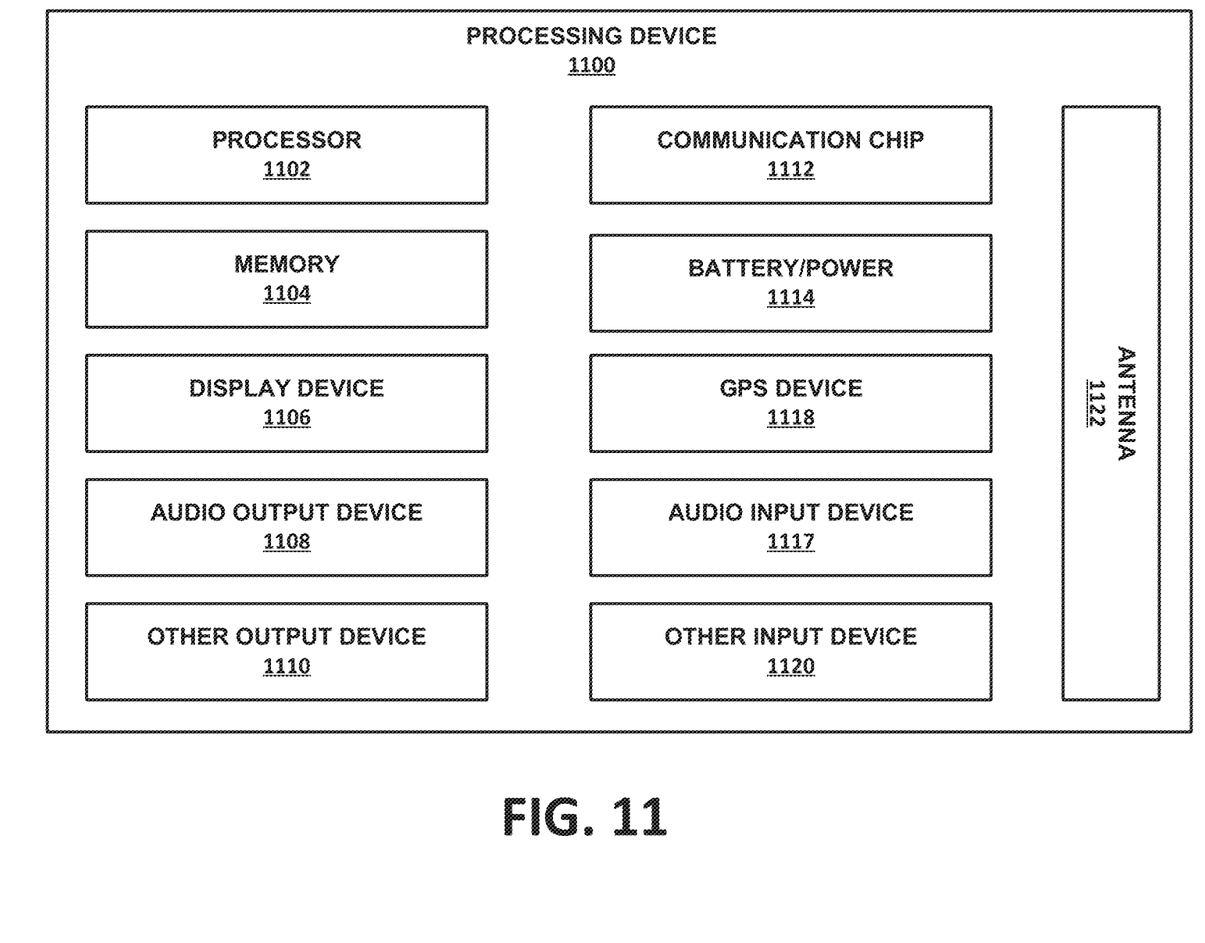
FIG. 11 illustrates a block diagram of an example computing device that may include one or more components with one or more metallization stacks.

Moreover, the metallization stacks disclosed herein may be included in any suitable electronic device. FIGS. 10 and 11 illustrate various examples of apparatuses that may include one or more of the metallization stacks disclosed herein.

FIGS. 8A-E illustrate an example of via steering using self-aligned hard masks with converted liners. In some embodiments, for example, a semiconductor circuit or chip may include multiple layers of interconnects formed using one or more metallization stacks, such as the metallization stacks from FIGS. 1-7. Moreover, interconnects in different layers of the chip may be connected using vias. A via is an electrical connection between different interconnect layers that extends through the plane of a chip. The interconnects of these chips are being manufactured using decreasingly smaller pitches (e.g., narrower and/or closer together) in order to accommodate the need for smaller chips. As the pitch of an interconnect decreases, however, it becomes increasingly difficult to properly align a via with the particular interconnect. In particular, during manufacturing, the alignment of a via with respect to a corresponding interconnect of a particular layer will vary due to natural variations in the manufacturing process, resulting in misalignment between the via and the interconnect. If the via is misaligned to the extent that it unintentionally comes in contact with the wrong interconnect or another unintended metal component, the chip may short circuit, resulting in degraded performance and/or a faulty chip. Accordingly, a via must be aligned to the appropriate interconnect within a particular margin of error in order to avoid erroneously connecting or shorting to the wrong interconnect or other metal component. Although the size of a via could be decreased to reduce the impact of misalignment, reducing the via size may result in degraded performance (e.g., due to higher resistance) and also reduced yield for via manufacturing.

Accordingly, in some embodiments, vias may be created using self-aligned hard masks with converted liners. A self-aligned hard mask, for example, is an etch mask that can be used to steer a next-layer via to land on the metal below the hard mask (e.g., the metal in a particular trench used to form an interconnect).

For example, an interlayer dielectric (ILD) may be patterned to form a trench, and the trench may be lined with a metallic liner (e.g., metallic or metal nitride). Examples of materials that could be used for the liner include, but are not limited to, one or more of molybdenum (Mo), manganese (Mn), manganese nitride, tantalum (Ta), tantalum nitride (TaN), titanium (Ti), titanium nitride (TiN), ruthenium (Ru), cobalt (Co), silicon nitride (SiN), silicon carbide (SiC), silicon dioxide (SiO2), aluminum oxide (Al2O3), and the like. The liner, for example, may be used as an adhesive between the ILD and any metal deposited in the trench, and may also prevent metal from leaking out of the trench into the ILD. The trench may then be filled with metal, and the metal may then be polished to remove any excess metal flowing from the trench. The metal may then be recessed below the top opening of the trench to form a hollow portion above the metal in the trench, which can be used as the housing for the hard mask.

The metal recess process, however, is selective to the metallic liner (e.g., metallic or metal nitride), and thus the liner remains even after recessing the metal. Moreover, since the liner may be a conductive metal material, leaving it behind is counterproductive to the via alignment and steering problem. In some cases, an additional process could be used to remove the liner. Alternatively, however, the liner can be modified to make it a leave behind dielectric. For example, if the liner is a nitride and is exposed to an oxidizing plasma, then it will be converted into an oxide. Metal oxides are typically dielectrics. Besides oxides, other types of conversions into metallic dielectrics include processes that would result in silicates, oxynitrides, or any other non-leaky dielectric. In this manner, the liner may simply be converted into a leave behind dielectric rather than removing the liner altogether, as it is much more efficient to convert the liner instead of removing it.

After the liner is converted into a leave behind dielectric, the particular hard mask material can then be deposited into the hollow portion of the trench on top of the recessed metal. Examples of materials that could be used for the hard mask include, but are not limited to, one or more of silicon nitride (SiN), silicon dioxide (SiO2), silicon oxy-carbo nitride (SiOCN), aluminum oxide (Al2O3), silicon carbide (SiC), silicon oxy-carbide (SiOC), zirconium oxide (ZrO2), and hafnium oxide (HfO2), and the like. Given that depositing the hard mask material into the hollow portion of the trench results in the hard mask being positioned directly above the metal, the hard mask is "self-aligned" by design. The hard mask material may then be polished to remove any excess hard mask material flowing from the trench. At this point, a via can be created using the hard mask to steer the via, for example, by etching the hard mask using an etching approach that is selective to the hard mask material and not the surrounding ILD.

Accordingly, converting the liner of a self-aligned hard mask into a leave-behind dielectric avoids the problem of having to recess the liner after the metal is recessed. This invention is particularly useful when the pitch (metal width+ ILD width) is approximately 40 nanometers (nm) or smaller.

FIGS. 8A-E illustrate five stages associated with using self-aligned hard masks with converted liners for via steering: (1) post-polish; (2) metal recess; (3) liner modification; (4) hard mask deposition and polish; and (5) via steering. In FIGS. 8A-E, where a FIGURE includes multiple features or components of the same or similar kind (e.g., multiple metal trenches 804), only one of those features or components are labeled with a reference number for ease of illustration.

Figure 8A:
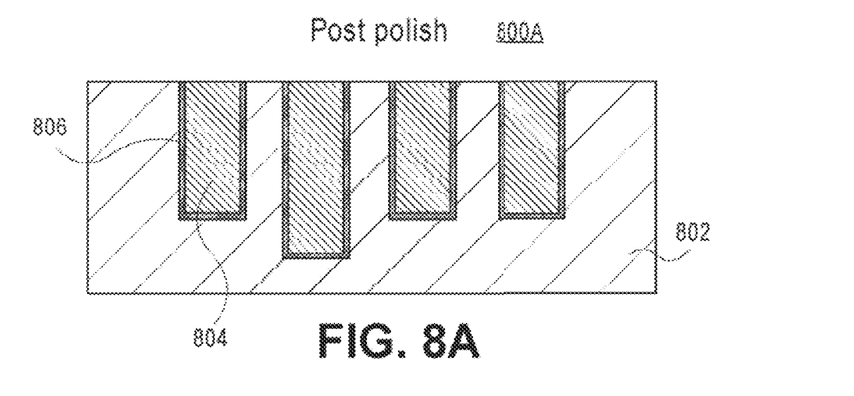
FIGS. 8A-E illustrate an example of via steering using self-aligned hard masks with converted liners.

FIG. 8A illustrates a metallized interconnect 800A that includes an interlayer dielectric 802, multiple trenches filled with metal 804, and a liner 806 in each trench. FIG. 8A illustrates the starting point for the process, which is the metallized interconnect 800A that has been polished to remove any excess metal over the trenches. Thus, at this stage, the trenches have already been formed in the interlayer dielectric 802 and liners 806 have been added to the trenches, the trenches have been filled with metal, and the metallized interconnect 800A has been polished to remove the metal over the trenches.

Figure 8B:
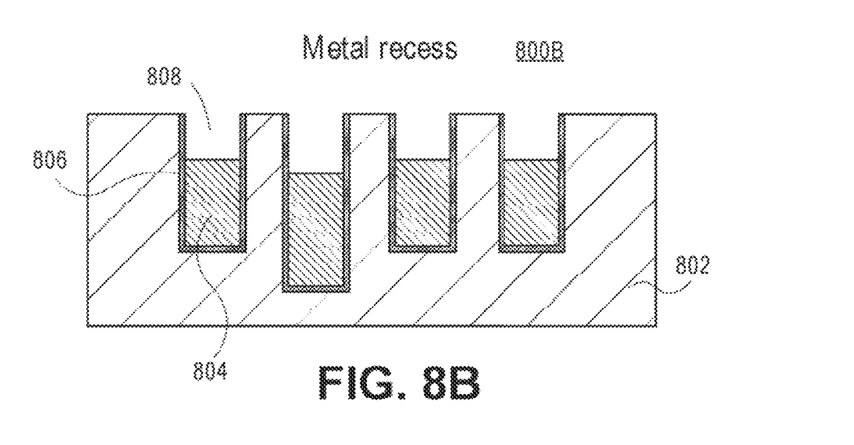

As shown in FIG. 8B, the metal 804 is then exposed to a wet etch or dry etch to recess the metal 804 selective to the liner 806, creating a hollow portion 808 above the metal 804 in the trench.

Figure 8C:
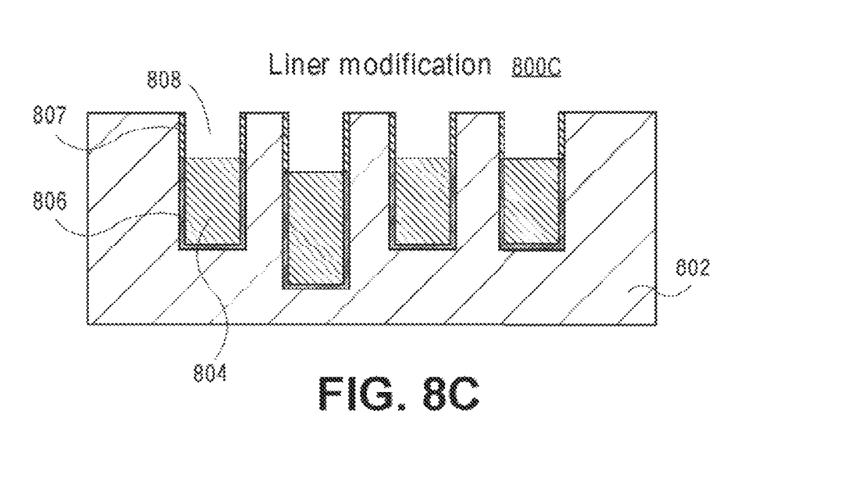

As shown in FIG. 8C, the liner 806 is then modified to make it a leave behind dielectric 807. For example, if the liner 806 is a nitride and is exposed to an oxidizing plasma, then it will be converted into an oxide. Metal oxides are typically dielectrics. Besides oxides, other types of conversions into metallic dielectrics include processes that would result in silicates, oxynitrides, or any other non-leaky dielectric. In this manner, the liner 806 may simply be converted into a leave behind dielectric rather than removing the liner altogether, as it is much more efficient to convert the liner rather than remove it.

Figure 8D:
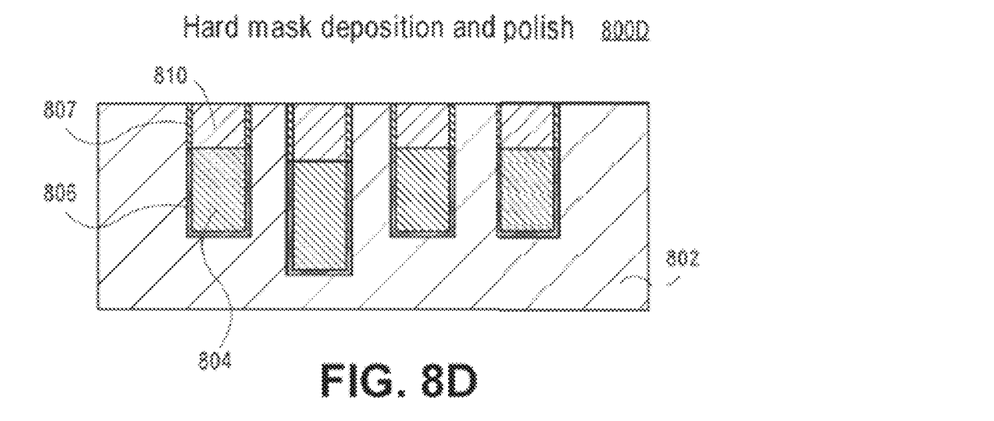

As shown in FIG. 8D, after the liner 806 is converted into a leave behind dielectric 807, the particular hard mask 810 material can then be deposited into the hollow portion of the trench on top of the recessed metal 804. Given that depositing the hard mask material into the hollow portion of the trench results in the hard mask 810 being positioned directly above the metal 804, the hard mask is "self-aligned" by design. The hard mask material may then be polished to remove any excess hard mask material flowing from the trench.

Figure 8E:
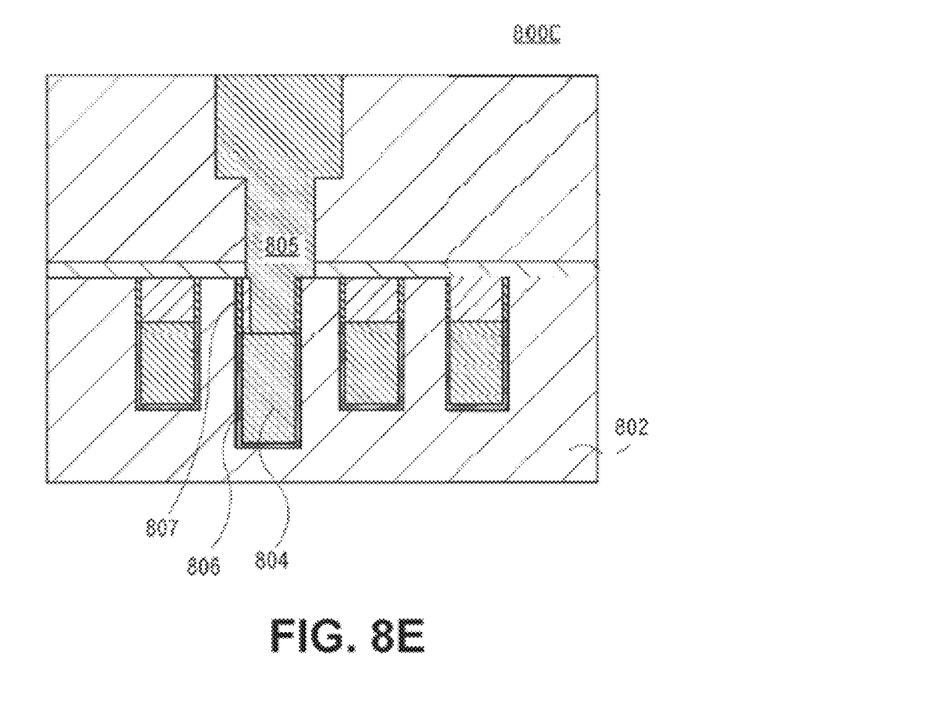

Finally, as shown in FIG. 8E, the next step is the next layer patterning. A via 805 can be created using the hard mask to steer the via 805, for example, by etching the hard mask using an etching approach that is selective to the hard mask material and not the surrounding ILD 802. In this manner, the via is etch through the hard mask without etching the surrounding ILD 802.

Figure 9:
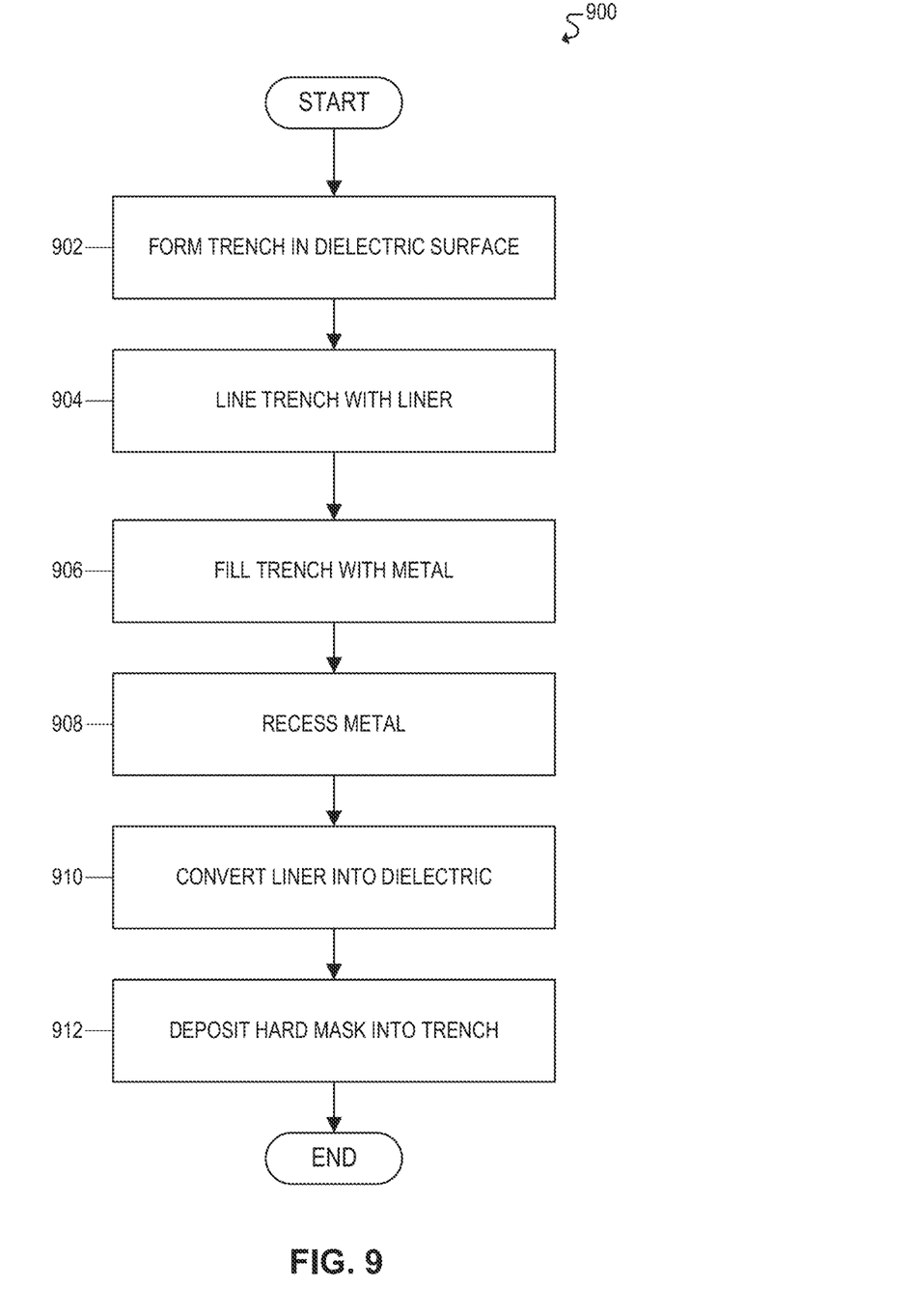
FIG. 9 illustrates a flowchart for an example embodiment of creating a self-aligned hard mask with converted liners.

FIG. 9 illustrates a flowchart 900 for an example embodiment of creating a self-aligned hard mask with converted liners. Flowchart 900 may be implemented, in some embodiments, using the components and processes described throughout this disclosure.

The flowchart may begin at block 902 by forming a trench in a dielectric surface. In some embodiments, for example, the dielectric surface may be patterned to form one or more trenches.

The flowchart may then proceed to block 904 to line the trench with a liner. The liner, for example, may be used as an adhesive between the dielectric surface and any metal deposited in the trench, and may also prevent metal from leaking out of the trench into the dielectric surface. In some embodiments, the liner may be a metallic liner, such as a nitride.

The flowchart may then proceed to block 906 to fill the trench with a metal, such as a conductive metal used to form an interconnect. Moreover, in some embodiments, the metal may be polished to remove excess metal outside the trench. The flowchart may then proceed to block 908 to recess the metal below an opening of the trench. In some embodiments, for example, the metal may be recessed below the opening of the trench to form a hollow portion of the trench above the recessed metal.

The flowchart may then proceed to block 910 to convert the liner of the trench into a dielectric. In some embodiments, for example, a portion of the liner associated with the hollow portion of the trench may be converted into a dielectric (e.g., a leave-behind dielectric material), such as an oxide, silicate, or oxynitride. Moreover, in some embodiments, the liner may be converted into a dielectric by exposing the liner to an oxidizing plasma.

The flowchart may then proceed to block 912 to deposit a hard mask into the trench. In some embodiments, for example, the hard mask may be deposited into the hollow portion of the trench. Moreover, in some embodiments, the hard mask may then be polished to remove excess hard mask material outside the trench. In this manner, the hard mask may subsequently be used to steer or align a via used to connect interconnects in different interconnect layers.

At this point, the flowchart may be complete. In some embodiments, however, the flowchart may restart and/or certain blocks may be repeated. For example, in some embodiments, the flowchart may restart at block 902 to continue forming trenches and depositing hard masks in the trenches. It should also be noted that, in some alternative implementations, the functions noted in each block may occur out of the order noted in the FIGURES. For example, two blocks shown in succession may, in fact, be executed substantially concurrently, or the blocks may sometimes be executed in the reverse order or alternative orders, depending upon the functionality involved.

FIGS. 10A and 10B are top views of a wafer 1000 and dies 1002 that may include one or more metallization stacks in accordance with any of the embodiments disclosed herein. The wafer 1000 may be composed of semiconductor material and may include one or more dies 1002 having IC structures formed on a surface of the wafer 1000. Each of the dies 1002 may be a repeating unit of a semiconductor product that includes any suitable IC (e.g., ICs including one or more components that include one or more metallization stacks 100). After the fabrication of the semiconductor product is complete (e.g., after manufacture of a metallization stack 100 in a particular electronic component, e.g. in a transistor or in a memory device), the wafer 1000 may undergo a singulation process in which each of the dies 1002 is separated from one another to provide discrete "chips" of the semiconductor product. In particular, devices that include a metallization stack as disclosed herein may take the form of the wafer 1000 (e.g., not singulated) or the form of the die 1002 (e.g., singulated). The die 1002 may include one or more transistors and/or supporting circuitry to route electrical signals to the transistors, as well as any other IC components (e.g., one or more of the interconnects discussed herein, which may take the form of any of the metallization stacks described herein). In some embodiments, the wafer 1000 or the die 1002 may include a memory device (e.g., a static random access memory (SRAM) device), a logic device (e.g., an AND, OR, NAND, or NOR gate), or any other suitable circuit element. Multiple ones of these devices may be combined on a single die 1002. For example, a memory array formed by multiple memory devices may be formed on a same die 1002 as a processing device (e.g., processor 1102 of FIG. 11) or other logic that is configured to store information in the memory devices or execute instructions stored in the memory array.

FIG. 11 illustrates a block diagram of an example computing device 1100 that may include one or more components including one or more metallization stacks in accordance with any of the embodiments disclosed herein. For example, any suitable ones of the components of the computing device 1100 may include a die (e.g., the die 1002 of FIG. 10B) having one or more metallization stacks 100. Any one or more of the components of the computing device 1100 may include, or be included in, an integrated circuit device or assembly.

A number of components are illustrated in FIG. 11 as included in the computing device 1100, but any one or more of these components may be omitted or duplicated, as suitable for the application. In some embodiments, some or all of the components included in the computing device 1100 may be attached to one or more motherboards. In some embodiments, some or all of these components are fabricated onto a single system-on-a-chip (SoC) die.

Additionally, in various embodiments, the computing device 1100 may not include one or more of the components illustrated in FIG. 11, but the computing device 1100 may include interface circuitry for coupling to the one or more components. For example, the computing device 1100 may not include a display device 1106, but may include display device interface circuitry (e.g., a connector and driver circuitry) to which a display device 1106 may be coupled. In another set of examples, the computing device 1100 may not include an audio input device 1124 or an audio output device 1108, but may include audio input or output device interface circuitry (e.g., connectors and supporting circuitry) to which an audio input device 1124 or audio output device 1108 may be coupled.

The computing device 1100 may include a processing device 1102 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1102 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 1100 may include a memory 1104, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1104 may include memory that shares a die with the processing device 1102. This memory may be used as cache memory and may include embedded dynamic random access memory (eDRAM) or spin transfer torque magnetic random-access memory (STT-MRAM).

In some embodiments, the computing device 1100 may include a communication chip 1112 (e.g., one or more communication chips). For example, the communication chip 1112 may be configured for managing wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1112 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1112 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1112 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1112 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1112 may operate in accordance with other wireless protocols in other embodiments. The computing device 1100 may include an antenna 1122 to facilitate wireless communications and/or to receive other wireless communications (such as AM or FM radio transmissions).

In some embodiments, the communication chip 1112 may manage wired communications, such as electrical, optical, or any other suitable communication protocols (e.g., the Ethernet). As noted above, the communication chip 1112 may include multiple communication chips. For instance, a first communication chip 1112 may be dedicated to shorter-range wireless communications such as Wi-Fi or Bluetooth, and a second communication chip 1112 may be dedicated to longer-range wireless communications such as GPS, EDGE, GPRS, CDMA, WiMAX, LTE, EV-DO, or others. In some embodiments, a first communication chip 1112 may be dedicated to wireless communications, and a second communication chip 1112 may be dedicated to wired communications.

The computing device 1100 may include battery/power circuitry 1114. The battery/power circuitry 1114 may include one or more energy storage devices (e.g., batteries or capacitors) and/or circuitry for coupling components of the computing device 1100 to an energy source separate from the computing device 1100 (e.g., AC line power).

The computing device 1100 may include a display device 1106 (or corresponding interface circuitry, as discussed above). The display device 1106 may include any visual indicators, such as a heads-up display, a computer monitor, a projector, a touchscreen display, a liquid crystal display (LCD), a light-emitting diode display, or a flat panel display, for example.

The computing device 1100 may include an audio output device 1108 (or corresponding interface circuitry, as discussed above). The audio output device 1108 may include any device that generates an audible indicator, such as speakers, headsets, or earbuds, for example.

The computing device 1100 may include an audio input device 1124 (or corresponding interface circuitry, as discussed above). The audio input device 1124 may include any device that generates a signal representative of a sound, such as microphones, microphone arrays, or digital instruments (e.g., instruments having a musical instrument digital interface (MIDI) output).

The computing device 1100 may include a global positioning system (GPS) device 1118 (or corresponding interface circuitry, as discussed above). The GPS device 1118 may be in communication with a satellite-based system and may receive a location of the computing device 1100, as known in the art.

The computing device 1100 may include an other output device 1110 (or corresponding interface circuitry, as discussed above). Examples of the other output device 1110 may include an audio codec, a video codec, a printer, a wired or wireless transmitter for providing information to other devices, or an additional storage device.

The computing device 1100 may include an other input device 1120 (or corresponding interface circuitry, as discussed above). Examples of the other input device 1120 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1100 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 1100 may be any other electronic device that processes data.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

Example Implementations

The following examples pertain to embodiments described throughout this disclosure.

One or more embodiments may include an apparatus, comprising: a plurality of interconnect layers, wherein the plurality of interconnect layers comprises a first interconnect layer and a second interconnect layer, wherein the first interconnect layer comprises a first interconnect, and wherein the second interconnect layer comprises a second interconnect; a via connecting the first interconnect and the second interconnect; and wherein the first interconnect comprises a dielectric liner.

In one example embodiment of an apparatus, the dielectric liner comprises a nonconductive liner converted from a metallic liner.

In one example embodiment of an apparatus, the metallic liner comprises a nitride.

In one example embodiment of an apparatus, the dielectric liner comprises a metallic liner exposed to an oxidizing plasma.

In one example embodiment of an apparatus, the dielectric liner comprises a liner exposed to an oxidizing plasma.

In one example embodiment of an apparatus, the dielectric liner comprises an oxide.

In one example embodiment of an apparatus, the dielectric liner comprises a silicate.

In one example embodiment of an apparatus, the dielectric liner comprises an oxynitride.

One or more embodiments may include a method, comprising: forming a trench in a dielectric surface; lining the trench with a liner; filling the trench with a metal; recessing the metal below an opening of the trench; converting the liner into a dielectric; and depositing a hard mask into the trench.

In one example embodiment of a method, the method further comprises forming a via using the hard mask to align the via.

In one example embodiment of a method, the liner is converted into a leave-behind dielectric material.

In one example embodiment of a method, converting the liner into the dielectric comprises exposing the liner to an oxidizing plasma.

In one example embodiment of a method, the liner is a metallic liner.

In one example embodiment of a method, the liner is a nitride.

In one example embodiment of a method, the liner is converted into an oxide.

In one example embodiment of a method, the liner is converted into a silicate.

In one example embodiment of a method, the liner is converted into an oxynitride.

In one example embodiment of a method, recessing the metal below the opening of the trench forms a hollow portion of the trench, wherein the hollow portion of the trench is above the metal in the trench.

In one example embodiment of a method, converting the liner into the dielectric comprises converting a portion of the liner associated with the hollow portion of the trench into the dielectric.

In one example embodiment of a method, the hard mask is deposited into the hollow portion of the trench.

In one example embodiment of a method, the method further comprises polishing the metal to remove excess metal outside the trench.

In one example embodiment of a method, the method further comprises polishing the hard mask to remove excess hard mask material outside the trench.

In one example embodiment of a method, forming the trench in the dielectric surface comprises patterning the dielectric surface to form the trench.

One or more embodiments may include a computing device, comprising: a circuit board; and an integrated circuit disposed on the circuit board, wherein the integrated circuit comprises: a plurality of interconnect layers, wherein the plurality of interconnect layers comprises a first interconnect layer and a second interconnect layer, wherein the first interconnect layer comprises a first interconnect, and wherein the second interconnect layer comprises a second interconnect; a via connecting the first interconnect and the second interconnect; and wherein the first interconnect comprises a dielectric liner.

In one example embodiment of a computing device, the dielectric liner comprises a nonconductive liner converted from a metallic liner.

One or more embodiments may include an apparatus comprising means to perform a method from any of the preceding examples.

What is claimed is:

1. An apparatus, comprising:
   a plurality of interconnect layers, wherein the plurality of interconnect layers comprises a first interconnect layer and a second interconnect layer, wherein the first interconnect layer comprises a first interconnect, and wherein the second interconnect layer comprises a second interconnect; and
   a via connecting the first interconnect and the second interconnect;
   wherein the apparatus includes a trench in a first dielectric material, the trench includes a lower region including the first interconnect, the trench includes an upper region, the first interconnect includes a first line, the upper region includes a second liner, the first liner is in contact with the second liner, the first liner is a conductive material, the second liner is a second dielectric material, and the second dielectric material has a different material composition than the first dielectric material.

2. The apparatus of claim 1, wherein the second dielectric material comprises a metal element or a semiconductor element.

3. The apparatus of claim 1, wherein the second dielectric material further comprises nitrogen and oxygen.

4. The apparatus of claim 1, wherein the via extends into the upper region of the trench.

5. The apparatus of claim 1, wherein the upper region of the trench includes a hardmask material, and the hardmask material has a different material composition than the second liner.

6. The apparatus of claim 5, wherein at least a portion of the hardmask material is spaced apart from side walls of the trench by the second liner.

7. The apparatus of claim 5, wherein a portion of the via contacts the hardmask material.

8. The apparatus of claim 1, wherein a lower portion of the via is spaced apart from side walls of the trench by the second liner.

9. The apparatus of claim 1, wherein a central vertical axis of the via is not aligned with a central vertical axis of the trench.

10. A method, comprising:
    forming a trench in a dielectric surface;
    lining the trench with a liner;
    filling the trench with a metal;
    recessing the metal below an opening of the trench;
    converting the liner into a dielectric; and
    depositing a hard mask into the trench.

11. The method of claim 10, further comprising forming a via using the hard mask to align the via.

12. The method of claim 10, wherein converting the liner into the dielectric comprises exposing the liner to an oxidizing plasma.

13. The method of claim 10, wherein the liner is converted into an oxide, a silicate, or an oxynitride.

14. A computing device, comprising:
    a circuit board; and
    an integrated circuit disposed on the circuit board, wherein the integrated circuit comprises:
    a plurality of interconnect layers, wherein the plurality of interconnect layers comprises a first interconnect layer and a second interconnect layer, wherein the first interconnect layer comprises a first interconnect, and wherein the second interconnect layer comprises a second interconnect; and
    a via connecting the first interconnect and the second interconnect;
    wherein the via extends into an upper portion of a trench, the first interconnect is in a lower portion of the trench, the lower portion of the trench includes a conductive liner material, and the upper portion of the trench includes a dielectric liner material.

15. The computing device of claim 14, wherein the dielectric liner material comprises a metal element.

16. The computing device of claim 14, wherein the upper portion of the trench includes a hardmask material, and the hardmask material has a different material composition than the dielectric liner material.

17. The computing device of claim 16, wherein at least a portion of the hardmask material is spaced apart from side walls of the trench by the dielectric liner material.

18. The computing device of claim 16, wherein a portion of the via is adjacent to the hardmask material.

19. The computing device of claim 14, wherein a lower portion of the via is spaced apart from side walls of the trench by the dielectric liner material.

20. The computing device of claim 14, wherein the conductive liner material contacts the dielectric liner material.

* * * * *

UNITED STATES PATENT AND TRADEMARK OFFICE
CERTIFICATE OF CORRECTION

PATENT NO. : 10,937,689 B2
APPLICATION NO. : 16/465510
DATED : March 2, 2021
INVENTOR(S) : Manish Chandhok et al.

Page 1 of 1

It is certified that error appears in the above-identified patent and that said Letters Patent is hereby corrected as shown below:

In the Claims

In Column 17, Line 50, in Claim 1, delete "line" and insert -- liner --, therefor.

Signed and Sealed this
Eleventh Day of May, 2021

Drew Hirshfeld
*Performing the Functions and Duties of the*
*Under Secretary of Commerce for Intellectual Property and*
*Director of the United States Patent and Trademark Office*